United States Patent [19] — [11] 4,029,374

Nestor et al. — [45] June 14, 1977

[54] ELECTRICAL CONNECTOR FOR PRINTED CIRCUITS

[75] Inventors: Charles R. Nestor, Niles; John A. Yurtin, Southington, both of Ohio

[73] Assignee: General Motors Corporation, Detroit, Mich.

[22] Filed: May 24, 1976

[21] Appl. No.: 689,083

[52] U.S. Cl. ........................ 339/17 F; 339/17 LM; 339/176 MF

[51] Int. Cl.² .......................................... H05K 1/07

[58] Field of Search ......... 339/17 L, 17 LM, 17 M, 339/17 F, 176 MF, 176 MP, 19

[56] References Cited

UNITED STATES PATENTS

| | | | |
|---|---|---|---|
| 3,084,302 | 4/1963 | Braeutigam | 339/17 |
| 3,365,694 | 1/1968 | Parker | 339/17 |
| 3,417,362 | 12/1968 | Reynolds | 339/17 |
| 3,504,330 | 3/1970 | Holzhaeuser | 339/176 MP |
| 3,509,520 | 4/1970 | Cobban et al. | 339/176 MP |

*Primary Examiner*—Roy Lake
*Assistant Examiner*—Neil Abrams
*Attorney, Agent, or Firm*—F. J. Fodale

[57] ABSTRACT

An electrical connector comprises a connector body and terminal arrangement for electrically connecting a flexible printed circuit and a pair of hardboard printed circuits. The connector body has two rows of terminal receiving cavities, most of which receive generally U-shaped transition terminals which electrically connect the flexible printed circuit to one or the other of the hardboard printed circuits. The hardboard printed circuits may be electrically interconnected by a jumper terminal disposed in corresponding cavities of the two rows and directly engaging the confronting faces of the hardboard printed circuits and/or by a bridge terminal engaging transition terminals in corresponding cavities of the two rows.

4 Claims, 7 Drawing Figures

ELECTRICAL CONNECTOR FOR PRINTED CIRCUITS

This invention relates generally to electrical connectors and more particularly to electrical connectors for a wipe-in pinless connection to a flexible printed circuit.

The U.S. Pat. No. 3,365,694 granted to George W. Parker on Jan. 23, 1964 and assigned to the assignee of this invention shows a connector body and terminal arrangement which when plugged into a support panel makes a wipe-in pinless connection between the terminals and conductor strips on deflectable flap portions of a flexible printed circuit lying against the support panel. When the connector body is plugged in, the flexible printed circuit is electrically connected to lead wires attached to the terminals.

The object of this invention is to provide a connector body and terminal arrangement which is adapted to be plugged into a support panel to make a wipe-in pinless connection with a flexible printed circuit and thereafter receive at least one hardboard printed circuit and electrically connect the same with the flexible printed circuit via the terminals carried by the connector body.

Another object of this invention is to provide an arrangement of the above noted type which uses unitary sheet metal transition terminals of simplified design.

Yet another object of this invention is to provide an arrangement of the above noted type which is adapted to receive a plurality of hardboard printed circuits and which may employ either bridge or jumper terminals to electrically interconnect the same.

Figure 1:
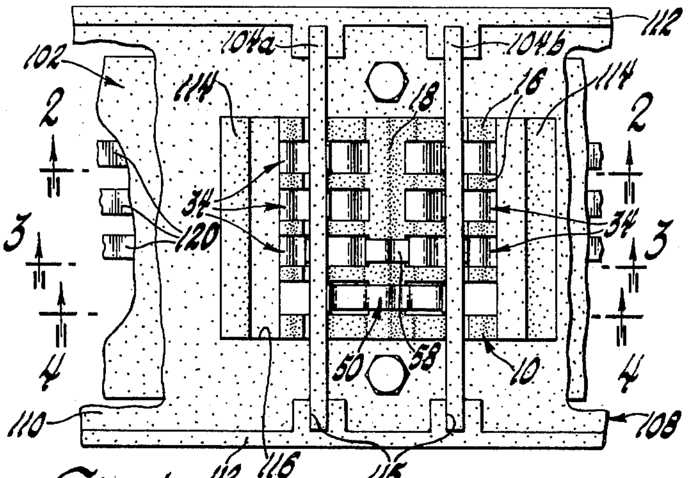
Figure 2:
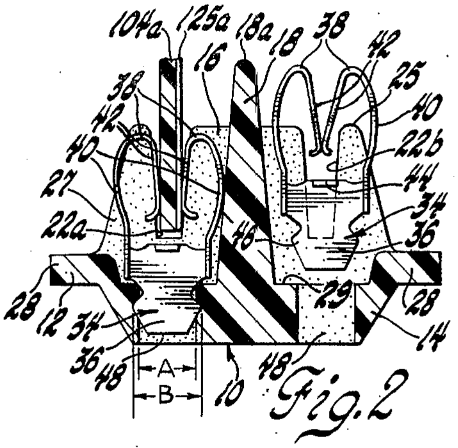
Figure 3:
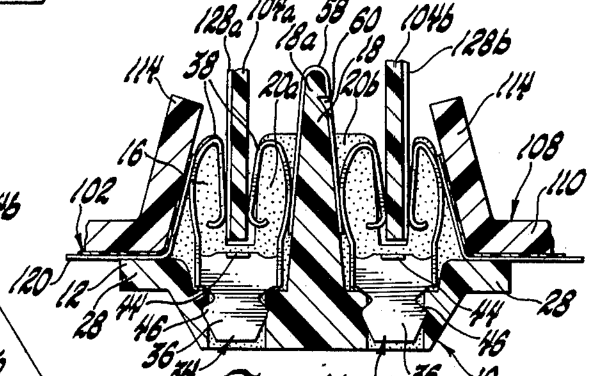
Figure 4:
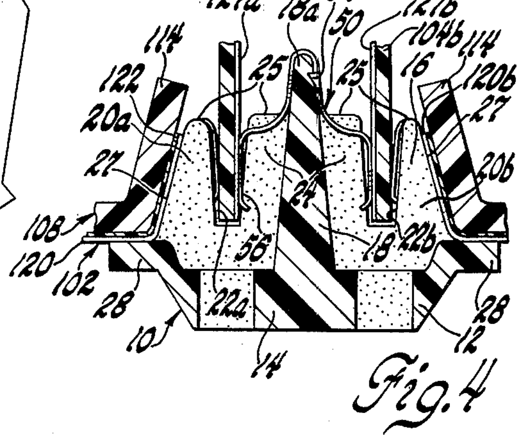

The exact nature of this invention as well as other objects and advantages thereof will be readily apparent from consideration of the following specification relating to the annexed drawing in which:

FIG. 1 is a top view of an electrical connector for printed circuits embodying this invention, FIG. 2, 3 and 4 are sections taken substantially along the lines 2—2, 3—3 and 4—4 respectively of FIG. 1. In FIG. 2, however, various components have been omitted and one terminal is exploded to illustrate internal detail.

Figure 5:
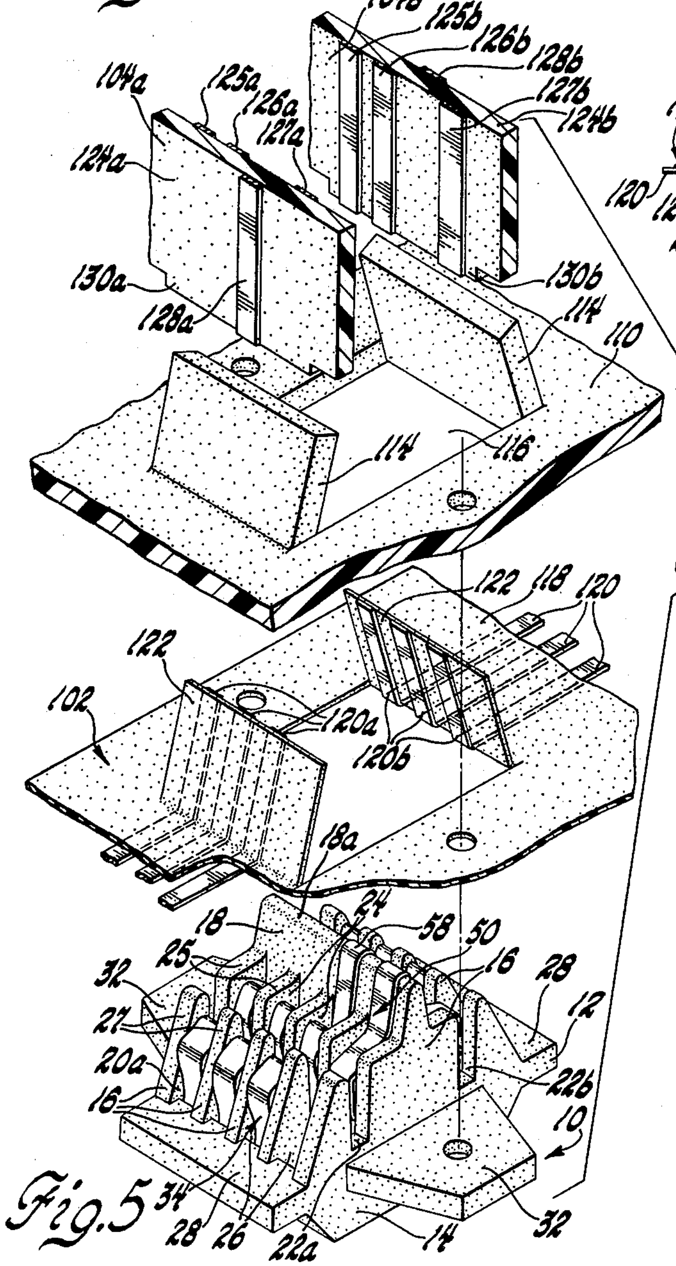
Figure 6:
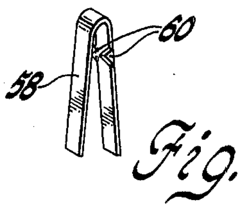
Figure 7:
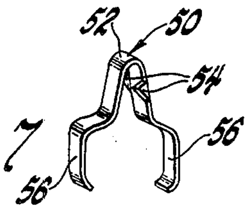

FIG. 5 is an exploded perspective view of the electrical connector shown in FIG. 1, FIG. 6 is a perspective view of an optional bridge terminal shown in FIGS. 1 through 5 and particularly in FIG. 3, FIG. 7 is a perspective view of an optional jumper terminal shown in FIGS. 1 to 5 and particularly in FIG. 4.

Referring now to the drawing the electrical connector 10 comprises a connector body 12 of a molded dielectric material such as nylon or polypropylene.

The connector body 12 has a base 14 and a number of generally parallel spaced, partition walls 16 perpendicularly disposed on the base 14. The connector body 12 further includes a perpendicular or vertical center wall 18 which joins the center portions of partition walls 16. The center wall 18 and the partition walls 16 define a first row of cavities 20*a* and a second row of cavities 20*b* respectively located on the left and right side of the center wall 18 as viewed in FIGS. 1 through 5. The center wall 18 tapers upwardly from the base 14 and has a rounded nose 18*a* protruding upwardly of or above the top end surfaces 25 of the partition walls 16. Each partition wall 16 has vertical slots 22*a* and 22*b* respectively on opposite sides of the center wall 18. Each vertical slot is a through slot which extends downwardly from the top end surface 25 of its associated partition wall 16 and preferably converges slightly in the downward direction. The slots 22*a* are aligned with each other and the slots 22*b* on the right side of the center wall 18 are aligned with each other. Each of the cavities 20*a* and 20*b* has a top opening 24 at the end remote from the base 14 and a communicating side opening 26 coplanar with the exposed slanted side end surfaces 27 of the partition walls 16. The top openings 24 for the cavities 20*a* and 20*b* communicate with the through slots 22*a* and >*b* respectively. The through slots 22*a* and the central portions of the cavities 20*a* and their top openings 24 form a first slot means for receiving a first hardboard printed circuit with various portions thereof disposed in each of the cavities 20*a*. The through slots 22*b* and the central portions of the cavities 20*b* and their openings form a second slot means for receiving a second hardboard printed circuit with various portions thereof received in the cavities 20*b*.

The connector body 12 also has coplanar ledges 28 connected to opposite ends of the base 14. The ledges 28 extend transversely of the partition walls 16 and protrude outwardly of the side end surfaces 27. The connector body 12 also has apertured attachment ears 32 which are coplanar with the ledges 28 and perpendicularly arranged therewith.

Three types of terminals may be utilized in the connector body 12. The first type is the generally U-shaped transition terminal 34 which is secured in six of the eight cavities 20*a* and 20*b*. Typically, the transition terminal 34 comprises a flat body 36 having two U-shaped contact arms 38. The contact arms 38 are cantilevered from the body 36 by end portions of the outer or remote legs 40 of the U-shaped contact arms 38 which end portions are integral with and perpendicular to the body 36. The inner or adjacent legs 42 of the U-shaped contact arms 38 converge toward each other in the direction toward the body 36 and biasingly engage opposite faces of a hardboard printed circuit received in the slots 22*a* or 22*b*. One of the outer legs 40 biasingly engages the center wall 18 while the other outer leg 40 extends laterally outwardly of its cavity through the side opening 26 beyond the slanted side end surfaces 27 of the partition walls 16 as best seen in FIGS. 2 and 5.

The upper end of the flat body 36 has a perpendicular pad 44 and the lower side edges have barbs 46. The transition terminals 34 are inserted in the cavities 20*a* and 20*b* through the top openings 24 barbed end first until the barbs 46 are received in one of the narrow slits 48 in the base 14 which extend downwardly from the bottom wall 29 of each cavity. The width of the slits 48 are slightly greater than the thickness of the terminal body 36 while the length "A" of the slits 48 is less than that of the cavity bottom wall 29 and slightly smaller than the width "B" of the terminal body 36 across the barbs 46 as best seen in FIG. 2. The transition terminals 34 are secured in the cavities 20*a* and 20*b* by pushing down on the pads 44 and forcing the barbs 46 to dig into the base 14 at the ends of the slits 48. The enlarged upper portion of the body 36 prevents overinsertion of the transition terminals 34 by engaging the bottom wall 29.

Each of the cavities 20*a* and 20*b* may receive a transition terminal 34 for electrically connecting a flexible printed circuit with one of the hardboard printed circuits. However, in the example illustrated, the two lowermost cavities 22*a* and 22*b* as viewed in FIG. 1 do not have a transition terminal 34 secured therein in order to demonstrate one way of interconnecting the two hardboard printed circuits that is, by the optional jumper terminal 50 shown in FIG. 7.

The jumper terminal 50 comprises a generally V-shaped clip 52 with barbs 54 which secure the jumper terminal 50 to the protruding nose 18*a*. Integral S-shaped portions at each end of the clip 52 carry first and second spring tongues 56 which are disposed respectively in the cavities 20*a* and 20*b* on opposite sides of the wall 18 from one another. The spring tongues 56 respectively protrude into the first and second slot means, that is the central portions of the cavities 20*a* and 20*b* which are the projected areas of the slots 20*a* and 22*b*. The jumper terminal 50 thus electrically interconnects the two printed circuit boards via conductor strips on the confronting faces thereof as shown in FIG. 4.

In some instances it may be desirable to electrically interconnect the two printed circuit boards via conductor strips on the remote or back faces of the two printed circuit boards. In such instances, the bridge terminal 58 shown in FIG. 6 is used in conjunction with a pair of transition terminals 34. The bridge terminal 58 comprises a generally V-shaped body formed to conform to the cross section of the protruding nose 18*a* and center wall 18. The bridge terminal 58 also has a pair of barbs 60 adjacent its rounded apex which secures the bridge terminal 58 to the protruding nose 18*a* with the free end portions of the bridge terminal 58 disposed respectively in one of the cavities 22*a* and its counterpart cavity 22*b* on the opposite side of the wall 18 as shown in FIG. 3. The bridge terminal 58 thus electrically connects a pair of transition terminals 34 disposed in corresponding cavities of the two rows. The set of transition terminals 34 in turn electrically connects conductor strips on the remote faces of the two hardboard printed circuits as shown in FIG. 3.

Referring now to FIGS. 1 and 5, the electrical connector 10 comprising the connector body 12, six transition terminals 34, a jumper terminal 50 and a bridge terminal 58 electrically connects a flexible printed circuit and a pair of hardboard printed circuits in conjunction with an apertured support 108.

The support 108 is preferably molded dielectric material and comprises a bottom wall 110, side walls 112 and two inclined walls 114 transverse to the side walls 112. The inclined walls 114 are at opposite edges of a rectangular aperture 116 through the bottom wall 110 and converge toward each other forming continuous obtusely angled portions in conjunction with the bottom wall 110. The incline of the walls 114 is substantially equal to the slant of the side end surfaces 27 of the connector body partition walls 16.

The flexible printed circuit 102 comprises a flexible insulating sheet 118 of plastic such as Mylar, a polyester polymer, and a number of thin flexible conductor strips 120 of copper or the like secured on a surface thereof.

The flexible printed circuit 102 has an H-shaped cut which forms deflectable flap portions 122. The flexible printed circuit 102 may have a second Mylar sheet laminated on the first sheet to insulate the conductor strips 120. In such an instance, however, the conductor strip portions on the flap portions would be uninsulated as shown in FIG. 5. The flap portion 122 may be prebent to an obtuse angle matching that of the inclined walls 114.

In any event the flexible printed circuit 102 is placed against the undersurface of the bottom wall 110 and the connector 10 is plugged into the aperture 116 passing through the opening of the flexible printed circuit 102 (formed by the H-shaped slit) forcing the flap portions 122 against the inclined walls 114. The connector 10 may be secured to the support 108 by nuts and bolts or other suitable means such as the latch arm arrangement shown in the aforementioned Parker patent may be utilized.

In the assembled position, the ends of the three conductor strips 120*a* on one flap portion are aligned with the three upper cavities 20*a* (as viewed in FIG. 1) and engaged by transition terminals 34 therein while the three conductor strip ends 120*b* on the other flap portion are engaged by the transition terminals 34 in the three upper cavities 20*b*.

Once secured, the connector 10 receives the hardboard printed circuits 104*a* and 104*b* respectively in the slot means partially defined by the through slots 22*a* and 22*b*. The hardboard printed circuit 104*a* comprises a rigid nonconductive plate 124*a* carrying three conductor strip portions 125*a*, 126*a* and 127*a* on one face and a fourth conductor strip portion 128*a* on an opposite face. The bottom corners of the plate 124*a* are notched providing a short tab 130*a* which matches the width of the aperture 116 to properly align the conductor strip portions 125*a*, 126*a*, 127*a* and 128*a* with respective ones of the cavities 20*a* when the lower end of the hardboard printed circuit 104*a* is inserted in the slots 22*a*. The hardboard printed circuit 104*b* received in the slots 22*b* has the same components identified with the same numerals and the letter designation *b*.

In the assembled position, the lateral edges of the hardboard printed circuits 104*a* and 104*b* may be disposed in channels 115 of the side wall 112 of the support 8 for lateral stability.

When the hardboard printed circuits 104*a* and 104*b* are received in the slots 22*a* and 22*b* respectively each has conductor strip portions connected to conductor strip portions of the flexible printed circuit 102 via the transition terminals 34. In addition, the hardboard printed circuits 104*a* and 104*b* are electrically interconnected through conductor strips 127*a* and 127*b* on their confronting faces via the jumper terminal 50. They are also electrically interconnected through conductor strips 128*a* and 128*b* on their remote faces via bridge terminal 58 in conjunction with a pair of transition terminals 34.

Thus it can be seen that the present invention provides an extremely versatile connector body and terminal arrangement for electrically connecting flexible and hardboard printed circuits.

We wish it to be understood that we do not desire to be limited to the exact details of construction shown and described, for obvious modifications will occur to a person skilled in the art.

We claim:

1. An electrical connector for electrically connecting flexible and hardboard printed circuits comprising:

a connector body having a base and a plurality of generally parallel partition walls perpendicularly disposed thereon to define at least one row of terminal receiving cavities, each of said terminal receiving cavities having a top opening at an end thereof remote from said base and side opening communicating with the top opening, each partition wall having a slot extending from an end surface thereof toward said base, said slots being aligned and generally perpendicular to said base and together with a central portion of each of said cavities including said top openings forming a slot means for receiving a hardboard printed circuit with different portions thereof disposed in each of said cavities, and a transition terminal secured in each of a number of said cavities, each said transition terminal comprising a body having a pair of U-shaped arms having remote resilient legs connected to the body in a cantilevered fashion and confronting resilient legs protruding into said central portion of said one cavity for engaging opposite faces of a hardboard printed circuit received in said slot means, each said transition terminal further having one of said remote resilient legs in its free unbiased state extending outwardly of one of said cavities through the side opening thereof and beyond a side surface of said connector body defined by coplanar side end surfaces of said partition walls whereby said transition terminal is adapted for biased engagement with a deflectable flap portion of a flexible printed circuit when said connector body is plugged into a panel aperture.

2. An electrical connector for electrically connecting a flexible printed circuit and a pair of hardboard printed circuits comprising:

a connector body having a base and a plurality of generally parallel partition walls perpendicularly disposed thereon and intersected by a center wall to define first and second rows of terminal receiving cavities, each of said terminal receiving cavities having a top opening at an end thereof remote from said base and a side opening remote from the center wall, each partition wall having first and second slots on opposite sides of said center wall extending from an end surface thereof toward said base, said first slots being aligned and generally perpendicular to said base and together with a central portion of each of said cavities and said top openings in said first row forming a first slot means for receiving a hardboard printed circuit with different portions thereof disposed in each of said cavities in said first row, said second slots being aligned and generally perpendicular to said base and together with a central portion of each of said cavities and said top openings in said second row forming a second slot means for receiving a hardboard printed circuit with different portions thereof disposed in each of said cavities in said second row, and a first transition terminal secured in at least one of said cavities in said first row and a second transition terminal secured in at least one of said cavities in said second row, said first and second transition terminals each having a pair of confronting resilient legs protruding into the central portion of its associated cavity for engaging opposite faces of one of a pair of hardboard printed circuits received in said first and second slot means respectively, said first and second transition terminals each further having a resilient cantilevered leg which in its free unbiased state extends outwardly of its associated cavity through the side opening thereof and beyond a side surface of said connector body defined by coplanar side end surfaces of said partition walls whereby said first and second transition terminals are adapted for biased engagement respectively with deflectable flap portions of a flexible printed circuit disposed against opposite side surfaces of said connector body when said connector body is plugged into a panel aperture.

3. An electrical connector for electrically connecting a flexible printed circuit and a pair of hardboard printed circuits comprising:

a connector body having a base and a plurality of generally parallel partition walls perpendicularly disposed thereon and intersected by a center wall to define first and second rows of terminal receiving cavities, each of said terminal receiving cavities having a top opening at an end thereof remote from said base and a communicating side opening remote from said center wall, each partition wall having first and second slots on opposite sides of said center wall extending from an end surface thereof toward said base, said first slots being aligned and generally perpendicular to said base and together with a central portion of each of said cavities including said top openings in said first row forming a first slot means for receiving a hardboard printed circuit with different portions thereof disposed in each of said cavities in said first row, said second slots being aligned and generally perpendicular to said base and together with a central portion of each of said cavities and said top openings in said second row forming a second slot means for receiving a hardboard printed circuit with different portions thereof disposed in each of said cavities in said second row, a transition terminal secured in each of a number of said cavities in said first row and in each of a number of said cavities in said second row, each said transition terminal comprising a body having a pair of U-shaped arms having remote resilient legs connected to the body in a cantilevered fashion and confronting resilient legs protruding into the central portion of its associated cavity for engaging opposite faces of one of a pair of hardboard printed circuits received in said first and second slot means respectively, each said transition terminal further having one of said remote resilient legs in its free unbiased state extending outwardly of its associated cavity through the side opening thereof and beyond a side surface of said connector body defined by coplanar side end surfaces of said partition walls whereby said transition terminals are adapted for biased engagement with a deflectable flap portion of a flexible printed circuit when said connector body is plugged into a panel aperture, and a jumper terminal mounted on said center wall, said jumper terminal having a pair of resilient legs disposed respectively in the central portions of a pair of cavities which are free of transition terminals and which are across the center wall from each other whereby said jumper terminal is adapted to electrically interconnect a pair of hardboard printed circuits received in said first and second slot means via the confronting faces thereof.

4. An electrical connector for electrically connecting a flexible printed circuit and a pair of hardboard printed circuits comprising:

a connector body having a base and a plurality of generally parallel partition walls perpendicularly disposed thereon and intersected by a center wall to define first and second rows of terminal receiving cavities, each of said terminal receiving cavities having a top opening at an end thereof remote from said base and a side opening remote from the center wall, each partition wall having first and second slots on opposite sides of said center wall extending from an end surface thereof toward said base, said first slots being aligned and generally perpendicular to said base and together with a central portion of each of said cavities and said top openings in said first row forming a first slot means for receiving a hardboard printed circuit with different portions thereof disposed in each of said cavities in said first row, said second slots being aligned and generally perpendicular to said base and together with a central portion of each of said cavities and said top openings in said second row forming a second slot means for receiving a hardboard printed circuit with different portions thereof disposed in each of said cavities in said second row, and a first transition terminal secured in a cavity in said first row and a second transition terminal secured in the cavity in said second row on the opposite side of said center wall from said cavity in said first row, each said transition terminal comprising a body having a pair of U-shaped arms haivng remote resilient legs connected to the body in a cantilevered fashion and confronting resilient legs protruding into the central portion of its associated cavity for engaging opposite faces of one of a pair of hardboard printed circuits received in said first and second slot means respectively, said first and second transition terminals each further having one of said remote resilient legs in its free unbiased state extending outwardly of its associated cavity through the side opening thereof and beyond a side surface of said connector body defined by coplanar side end surfaces of said partition walls whereby said transition terminals are adapted for biased engagement respectively with deflectable flap portions of a flexible printed circuit disposed against opposite side surfaces of said connector body when said connector body is plugged into a panel aperture, and the other of said remote resilient legs engaging a V-shaped bridge terminal mounted on said center wall for electrically interconnecting the transition terminals to electrically interconnect a pair of hardboard printed circuits received respectively in said first and second slot means via the remote faces thereof.

* * * * *